(12) United States Patent
Trivedi et al.

(10) Patent No.: US 9,431,267 B2
(45) Date of Patent: Aug. 30, 2016

(54) SEMICONDUCTOR DEVICE PROCESSING TOOLS AND METHODS FOR PATTERNING SUBSTRATES

(71) Applicant: Applied Materials, Inc., Santa Clara, CA (US)

(72) Inventors: Mayur Trivedi, Fremont, CA (US); Sushil Padiyar, San Jose, CA (US); Lakshmanan Karuppiah, San Jose, CA (US); Randhir Thakur, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

(21) Appl. No.: 14/093,503

(22) Filed: Dec. 1, 2013

(65) Prior Publication Data

US 2014/0154887 A1 Jun. 5, 2014

Related U.S. Application Data

(60) Provisional application No. 61/732,873, filed on Dec. 3, 2012.

(51) Int. Cl.
*H01L 21/311* (2006.01)
*H01L 21/308* (2006.01)
*H01L 21/67* (2006.01)

(52) U.S. Cl.
CPC ....... *H01L 21/3088* (2013.01); *H01L 21/3086* (2013.01); *H01L 21/67184* (2013.01); *H01L 21/67207* (2013.01)

(58) Field of Classification Search
None
See application file for complete search history.

(56) References Cited

U.S. PATENT DOCUMENTS 5,186,718 A  2/1993  Tepman et al.
5,882,165 A  3/1999  Maydan et al.
(Continued)

FOREIGN PATENT DOCUMENTS

JP    2009-094530        4/2009
KR  10-2011-0104420      9/2011
KR    10-1099605 B1     12/2011
KR  10-2012-0098487      9/2012

OTHER PUBLICATIONS

International Preliminary Report on Patentability of International Application No. PCT/US2013/072533 mailed Jun. 18, 2015.
(Continued)

*Primary Examiner* — Calvin Choi
(74) *Attorney, Agent, or Firm* — Dugan & Dugan, PC

(57) ABSTRACT

In some embodiments, an electronic device processing system is provided that includes a processing tool having a first subsystem configured to carry out a first subset of processes on a substrate having pattern features, the first subsystem including a first conformal deposition chamber and a first etch chamber. The processing tool includes a second subsystem coupled to the first subsystem and configured to carry out a second subset of processes on the substrate, the second subsystem including a second conformal deposition chamber and a second etch chamber. The processing tool is configured to employ the first and second subsystems to perform pitch division on the substrate within the processing tool so as to form a reduced-pitch pattern on the substrate. Numerous other embodiments are provided.

21 Claims, 6 Drawing Sheets

(56) References Cited

U.S. PATENT DOCUMENTS

2006/0057843 A1 3/2006 Chen et al.
2007/0190780 A1 8/2007 Chung et al.
2008/0008969 A1 1/2008 Zhou et al.
2008/0232947 A1 9/2008 Van Der Meulen et al.

OTHER PUBLICATIONS

Englhardt et al., U.S. Appl. No. 13/961,538, titled: Linked Vacuum Processing Tools and Methods of Using the Same, filed Aug. 7, 2013.

International Search Report and Written Opinion of International Application No. PCT/US2013/072533 mailed Mar. 10, 2014.

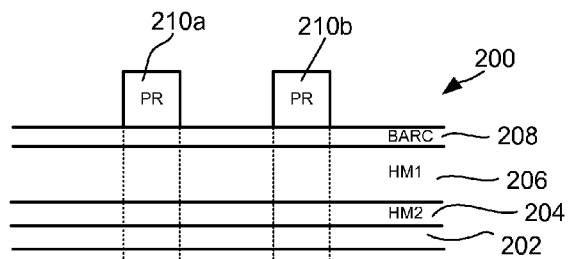
FIG. 2A
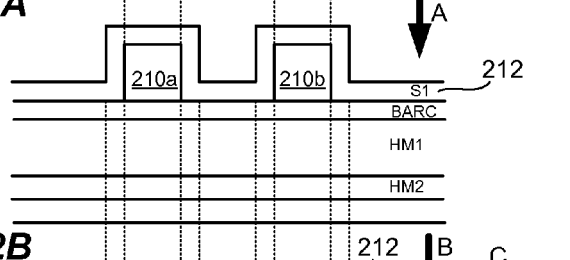
FIG. 2B
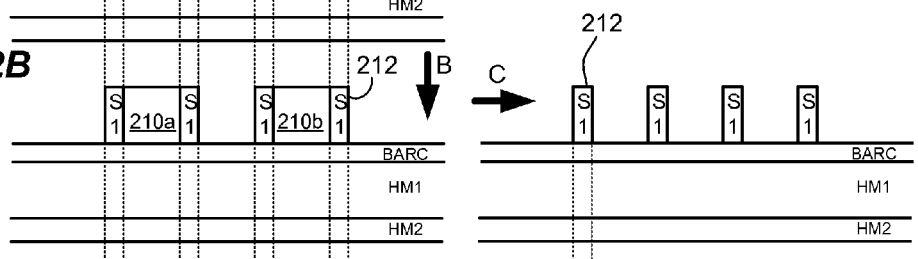
FIG. 2C
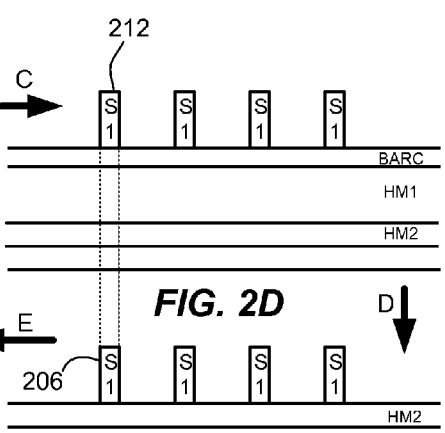
FIG. 2D
FIG. 2E
FIG. 2F
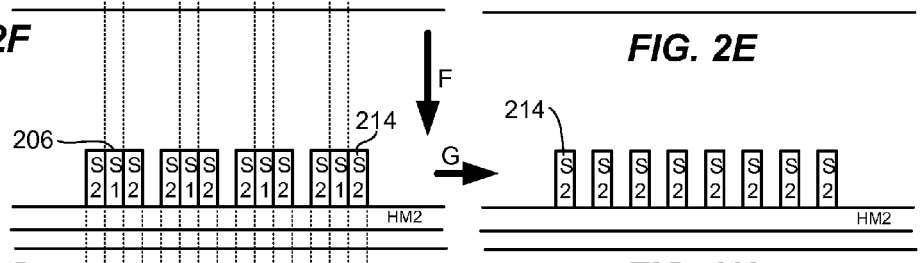
FIG. 2G
FIG. 2H
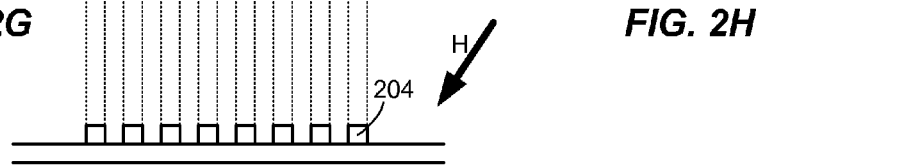
FIG. 2I

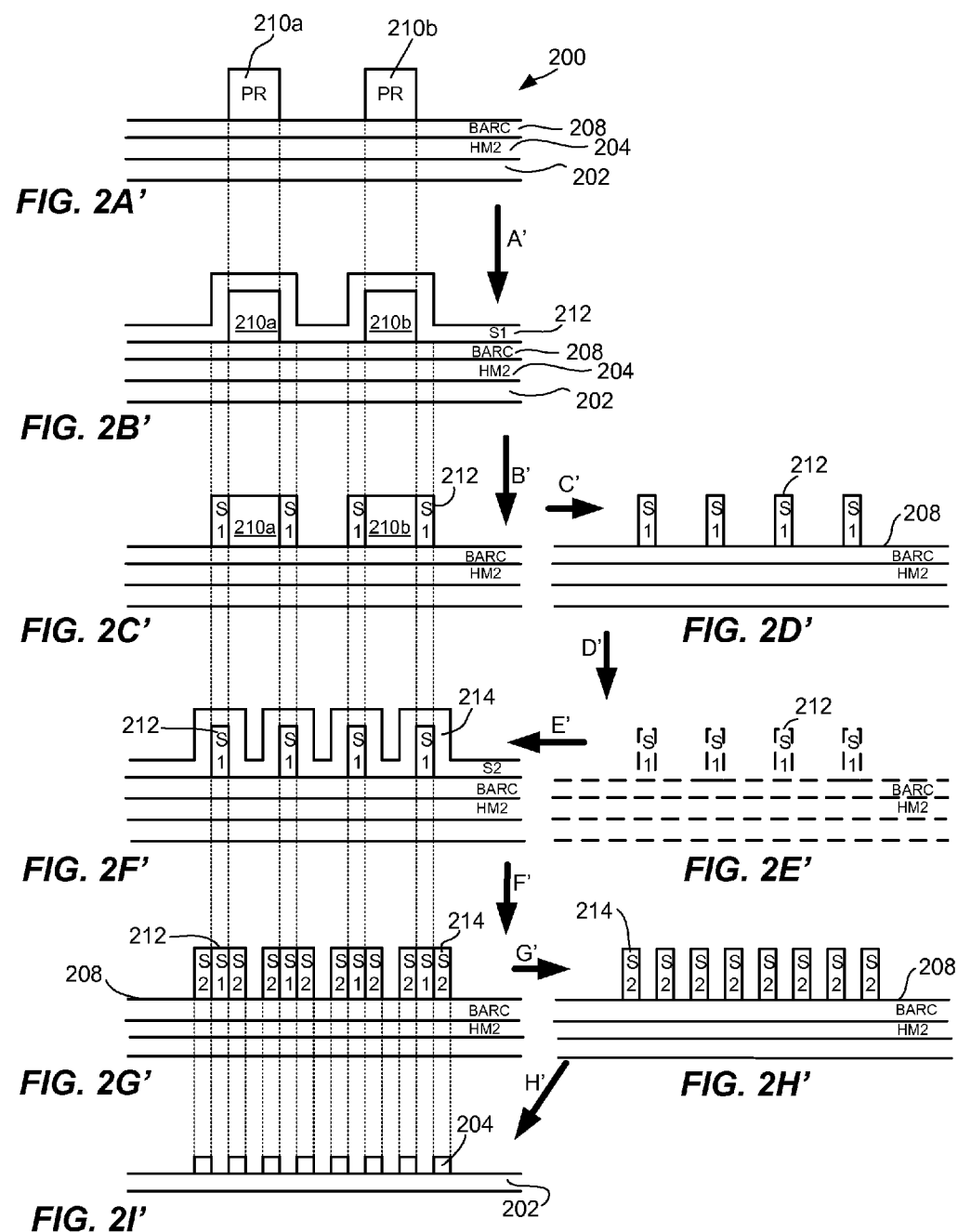

SEMICONDUCTOR DEVICE PROCESSING TOOLS AND METHODS FOR PATTERNING SUBSTRATES

The present application claims priority from U.S. Provisional Patent Application Ser. No. 61/732,873, filed Dec. 3, 2012, titled "SEMICONDUCTOR DEVICE PROCESSING TOOLS AND METHODS FOR PATTERNING SUBSTRATES," which is hereby incorporated by reference herein in its entirety for all purposes.

FIELD

The present application relates to electronic device manufacturing, and more specifically to semiconductor device processing tools and methods for patterning substrates.

BACKGROUND

Electronic devices typically are formed on semiconductor wafers, glass plates or other suitable substrates through a series of deposition, lithography, patterning and/or etch steps. The continual reduction in feature size of electronic devices makes lithography and patterning increasingly difficult. Accordingly, improved and more cost effective methods of patterning electronic devices are desirable.

SUMMARY

In some embodiments, an electronic device processing system is provided that includes a processing tool having a first subsystem configured to carry out a first subset of processes on a substrate having pattern features, the first subsystem including a first conformal deposition chamber and a first etch chamber. The processing tool includes a second subsystem coupled to the first subsystem and configured to carry out a second subset of processes on the substrate, the second subsystem including a second conformal deposition chamber and a second etch chamber. The processing tool is configured to employ the first and second subsystems to perform pitch division on the substrate within the processing tool so as to form a reduced-pitch pattern on the substrate.

In some embodiments, a method of producing a reduced-pitch pattern on a substrate is provided that includes (a) providing a processing tool including a first subsystem configured to carry out a first subset of processes on a substrate having pattern features, the first subsystem including a first conformal deposition chamber and a first etch chamber; and a second subsystem coupled to the first subsystem and configured to carry out a second subset of processes on the substrate, the second subsystem including a second conformal deposition chamber and a second etch chamber; (b) receiving a substrate having photoresist features formed on the substrate; (c) depositing a first conformal layer over the photoresist features within the processing tool; (d) removing first conformal layer material from horizontal surfaces of the substrate to expose the photoresist features within the processing tool; (e) removing the photoresist features to form pillars of first conformal layer material within the processing tool; (f) depositing a second conformal layer over the pillars of first conformal layer material within the processing tool; (g) removing second conformal layer material from horizontal surfaces of the substrate to expose the pillars of first conformal layer material within the processing tool; and (h) removing the pillars of first conformal layer material to form pillars of second conformal layer material within the processing tool.

In some embodiments, a method of producing a reduced-pitch pattern on a substrate is provided that includes (a) providing a processing tool including a first subsystem configured to carry out a first subset of processes on a substrate having pattern features, the first subsystem including a first conformal deposition chamber and a first etch chamber; and a second subsystem coupled to the first subsystem and configured to carry out a second subset of processes on the substrate, the second subsystem including a second conformal deposition chamber and a second etch chamber; (b) receiving a substrate having photoresist features formed on the substrate; (c) depositing a first conformal layer over the photoresist features within the processing tool; (d) removing first conformal layer material from horizontal surfaces of the substrate to expose the photoresist features within the processing tool; (e) removing the photoresist features to form pillars of first conformal layer material within the processing tool; (f) etching a first hard mask layer on the substrate using the pillars of first conformal layer material as an etch mask to form pillars of first hard mask layer material within the processing tool; (g) depositing a second conformal layer over the pillars of first hardmask layer material within the processing tool; (h) removing second conformal layer material from horizontal surfaces of the substrate to expose the pillars of first hardmask layer material within the processing tool; and (i) removing the pillars of first hardmask layer material to form pillars of second conformal layer material within the processing tool. Numerous other aspects are provided.

Other features and aspects of the present invention will become more fully apparent from the following detailed description, the appended claims and the accompanying drawings.

BRIEF DESCRIPTION OF THE DRAWINGS

FIGS. 2A-2I are schematic cross-sectional views of a substrate during an integrated process flow provided in accordance with embodiments of the invention.

FIGS. 2A'-2I' are schematic cross-sectional views of a substrate during an alternative integrated process flow provided in accordance with embodiments of the invention.

DETAILED DESCRIPTION

Figure 1A:
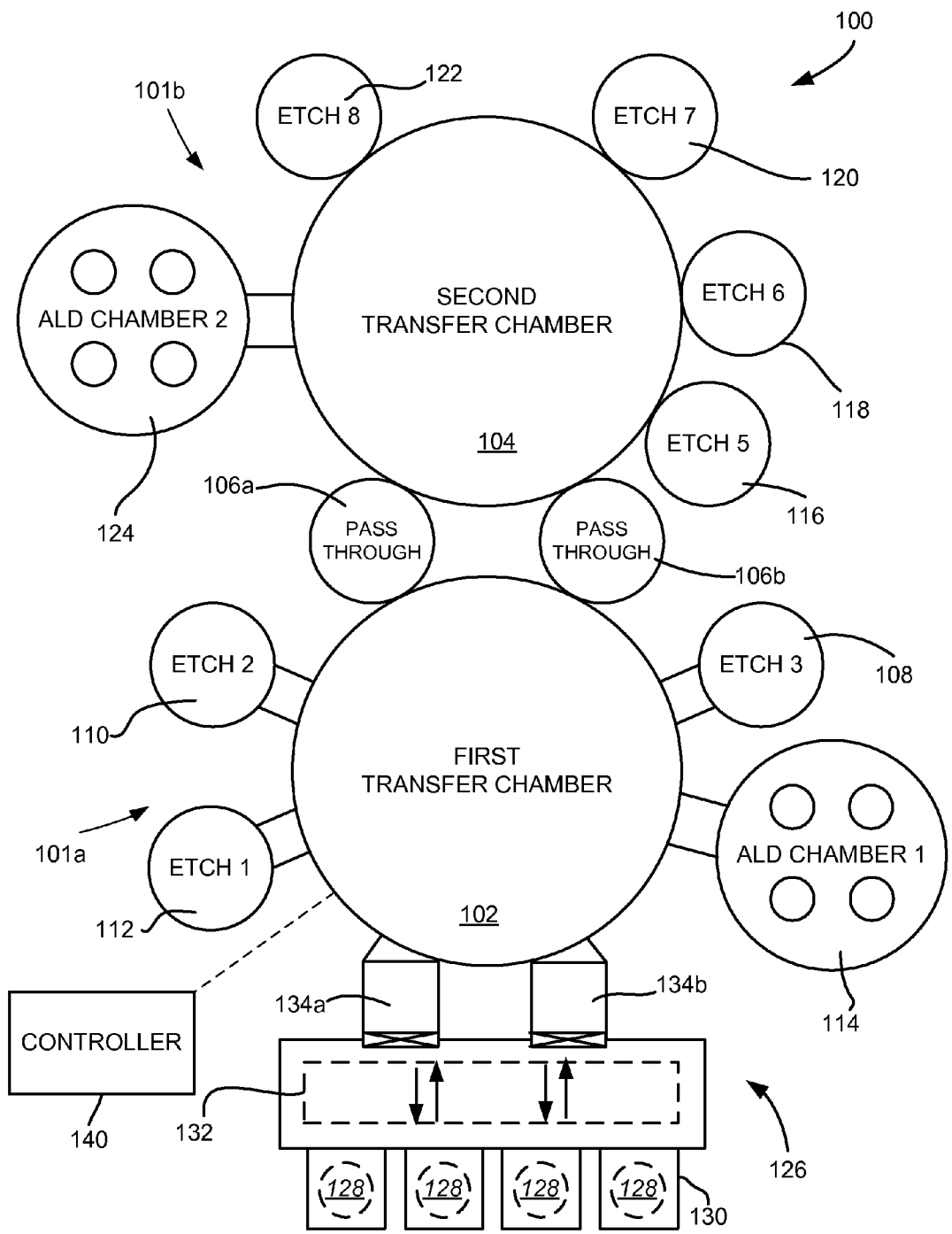
FIG. 1A illustrates a schematic top view of a semiconductor device processing system according to embodiments of the present invention.

In some embodiments of the present invention, a cluster tool is provided that has pitch division capability for a single lithography/exposed photoresist (PR) patterned incoming substrate. The cluster tool may be capable of multiple pitch division sequences (e.g., double, triple, quadruple and/or higher order pitch division) driven by tool sequencer control. For example, in one or more embodiments, the cluster tool may trim incoming material (e.g., photoresist or another material) and transfer the pattern of the trimmed material into an underlying layer. Multiple deposition, etch and clean (e.g., dry clean) cycles then may be performed within the cluster tool to divide pitch to a desired level (e.g., dividing pitch by 2, 4 or another power of 2).

The system provides capability to pattern <20 nm critical dimension (CD) with a clustered approach in which a substrate does not have to leave the cluster tool for a second lithography/exposure. This may dramatically improve substrate cycle time, cost of operation (CoO), pattern mismatching issues that are inherent with multiple lithography/exposure schemes (e.g, LELE) and/or integration issues with lithography and etch tools. For example, in some embodiments, a highly conformal carousel-based atomic layer deposition (ALD) chamber may be employed within the cluster tool. Such embodiments may enable low temperature processing and an ability to pattern around photo-resist, a key feature for patterning CoO.

In some embodiments, processes are provided for forming multiple patterns on a substrate which has received only a single lithography/exposure PR-patterning step. For example, an integrated process flow may be provided that outputs a substrate with multiple patterns from a single lithography/exposed PR-patterned incoming substrate (e.g., by employing pitch division).

Self-aligned double patterning (SADP) and self-aligned quadruple patterning (SAQP) typically are executed on a substrate with an incoming pattern of PR and a mask open etch to form a $1^{st}$ mandrel. The substrate then leaves the etch system to receive a $2^{nd}$ PR pattern transfer in a lithography system on a separate mainframe. Thereafter, the substrate returns to the etch system to selectively etch a $2^{nd}$ mandrel. This process employs multiple (e.g., double) lithography steps, and may lead to CD offset/mismatch between the two lithography steps.

In accordance with one or more embodiments of the invention, an integrated cluster tool is provided that includes an ALD deposition chamber and etch chamber on the same mainframe. A substrate with a PR pattern is provided to the cluster tool and is sent to an ALD chamber for deposition of a first conformal layer, such as conformal oxide, on the PR. The substrate is then sent to an etch chamber to remove the first conformal layer (e.g., ALD oxide) from horizontal surfaces.

Once the first conformal layer material has been removed from horizontal surfaces, the PR may be selectively removed while the first conformal layer material on both sides of the PR is maintained. This may be performed, for example, in an etch chamber, dry clean chamber and/or ashing chamber. The substrate then is sent to a second ALD chamber to deposit a second conformal layer, such as ALD nitride, over the remaining first conformal layer material (e.g., ALD oxide). The substrate then is transferred to an etch chamber to selectively etch all second conformal layer material from horizontal surfaces. An additional etch step then is employed to selectively remove the first conformal layer material from in between vertical sidewall structures of the second conformal layer material (e.g., leaving silicon nitride fins or "pillars"). These sidewalls structures may be employed as an etch mask for transferring the desired pattern into the underlying layer(s).

By providing dual ALD and etch step capability on the same mainframe, SADP capability is provided without employing a second lithography/exposure step and/or multiple transfers between multiple mainframes. This eliminates the risk of CD mismatch from two patterning steps. The end result is reduced substrate cycle time, CoO, and fully integrated SADP transfer on a substrate. In some embodiments, such a system may provide a capability to pattern <14 nm, and in some embodiments <10 nm, without extreme ultra-violet (EUV) lithography. Example embodiments of the invention are described below with reference to FIGS. 1A-4F.

FIG. 1A is a top schematic diagram of an example cluster tool 100 provided in accordance with embodiments of the invention. The cluster tool 100 includes a first transfer chamber 102 coupled to a second transfer chamber 104 via pass throughs 106a, 106b in a single mainframe. In the some embodiments the pass throughs may include processing stations such as a preclean station (e.g., a Siconi preclean chamber available from Applied Materials of Santa Clara, Calif. or a similar system), a cool down station, or the like.

The cluster tool 100 also includes process chambers 108, 110, 112 and/or 114 coupled to first transfer chamber 102 (forming a first subsystem 101a), and process chambers 116, 118, 120, 122 and/or 124 coupled to second transfer chamber 104 (forming a second subsystem 101b). Other numbers of process chambers may be coupled to each transfer chamber. A factory interface 126 may be employed to deliver substrates to and/or remove substrates from the cluster tool 100. For example, substrate carriers 128 may be placed on load ports 130. Substrates within the carriers 128 may be accessed by a robot delivery system 132 for delivery to the first transfer chamber 102 through load locks 134a and/or 134b.

In some embodiments, process chambers 108, 110, 112, 116, 118, 120 and/or 122 may be reactive ion or other etch chambers and/or dry clean chambers, and process chambers 114 and 124 may be ALD chambers. Single substrate or batch process chambers may be employed. In some embodiments, process chambers 114 and/or 124 may each be a carousel-based ALD chamber such as a Centinel chamber available from Applied Materials, Inc. of Santa Clara, Calif. or a similar system. As stated, other numbers, types and/or arrangements of process chambers may be employed.

In some embodiments, integrated metrology tools and/or systems may be included in the cluster tool 100. For example, one or more metrology tools (not shown), such as an Impulse® integrated metrology system available from Nanometrics, Inc. of Milpitas, Calif., an 1500® integrated metrology tool available from Nova Measuring Instruments, Ltd. of Rehovot, Israel, or the like, may be coupled to first transfer chamber 102 and/or second transfer chamber 104 and employed to measure CD or other parameters (e.g., after each etch step, periodically or at any desired time in a process).

Figure 1B:
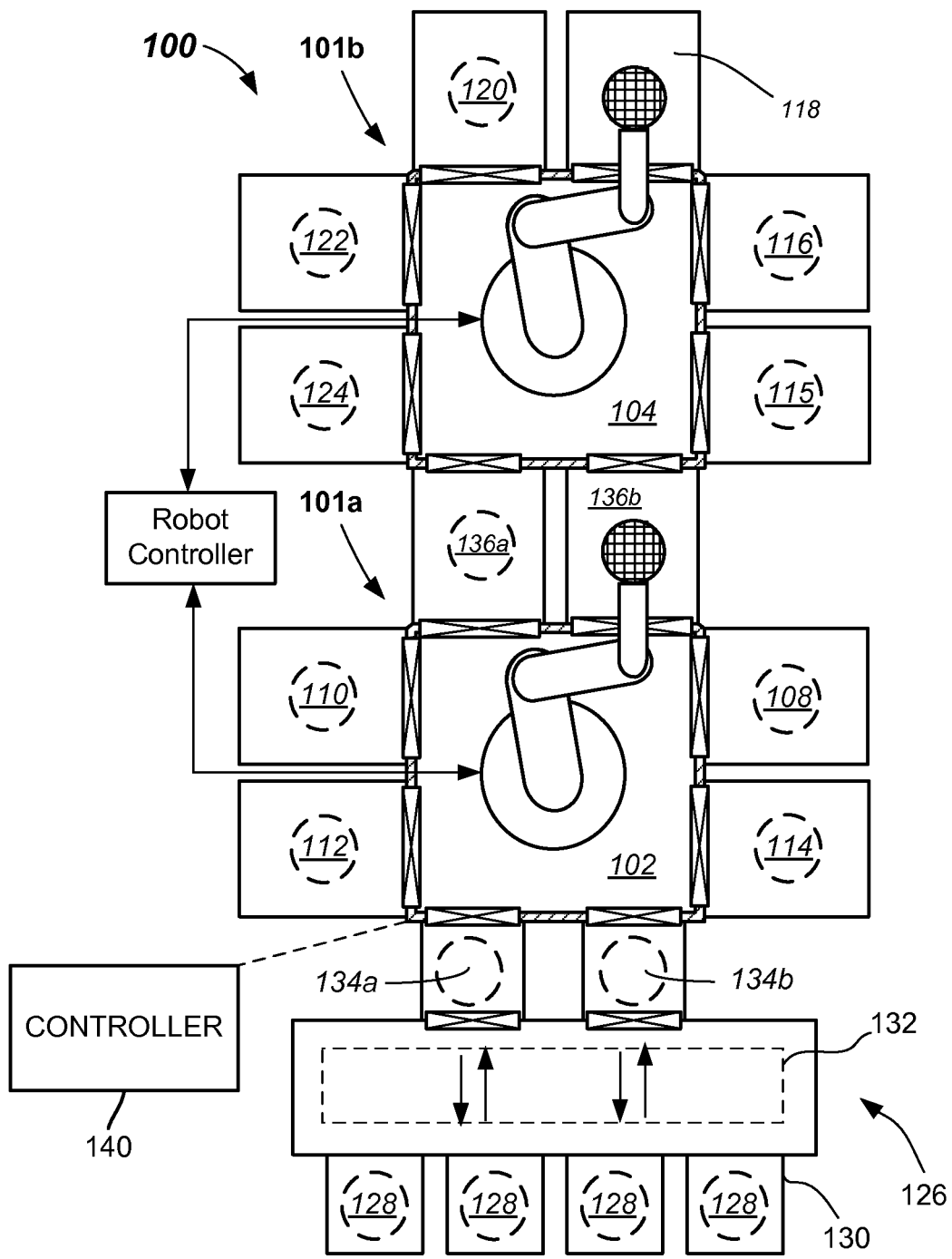
FIG. 1B is a schematic top view of an alternative embodiment of the semiconductor device processing system of FIG. 1A in accordance with embodiments of the present invention.

FIG. 1B is a schematic top view of an alternative embodiment of the cluster tool 100 in which a substrate is passed between first and second transfer chambers 102, 104 via pass throughs 136a, 136b. In some embodiments, such a cluster tool 100 may form first subsystem 101a for depositing and etching a first conformal layer, such as ALD oxide, on a substrate and a second subsystem 101b for depositing and etching a second conformal layer, such as ALD nitride, as described above with reference to FIG. 1A. An additional etch or other process chamber 115 may be provided if desired (shown coupled to second transfer chamber 104 in FIG. 1B).

As shown in FIGS. 1A and 1B, the cluster tool 100 may include a controller 140 configured to control at least a portion of the operation of cluster tool 100. The controller 140 may be a processor, such as a microprocessor, central processing unit (CPU), microcontroller or the like, for example. The controller 140 may include computer program code and/or one or more computer program products for performing at least a portion of one or more of the methods described herein. Each computer program product described herein may be carried by a non-transitory medium readable by a computer (e.g., a floppy disc, a compact disc, a DVD, a hard drive, a random access memory, etc.).

An example operation of the cluster tool 100 is described below with reference to FIGS. 2A-2I, which illustrate cross-sectional views of a substrate during an integrated process flow, shown by arrows A-H, in accordance with embodiments of the present invention.

FIG. 2A is a schematic cross sectional view of a substrate 200 that is to be processed within the cluster tool 100 of FIG. 1A. The substrate 200 includes a first layer 202 that is to be etched. For example, the first layer 202 may be a silicon layer or another layer to be patterned. Formed over first layer 202 is hard mask layer 204 (HM2), hard mask layer 206 (HM1), and bottom antireflection coating (BARC) layer 208. Pattern features, such as photoresist mandrels 210a, 210b, have been formed over BARC layer 208 via a lithography exposure/development step in a separate lithography system (not shown). A plurality of substrates 200 each having PR mandrels 210a, 210b formed thereon may be delivered to the cluster tool 100 in one or more substrate carriers 128 (if desired).

In some embodiments, the hard mask layer 204 and/or 206 may be an oxide, a nitride, an oxynitride, a carbon-doped oxide, or any other suitable hard mask material. For example, hard mask layer 204 may comprise silicon dioxide and hard mask layer 206 may comprise silicon nitride, or vice versa. In an example embodiment, hard mask layer 204 may be about 400 to about 2000 nanometers of carbon hard mask, boron nitride or hafnium based oxide, and hard mask layer 206 may be about 400 to about 2000 nanometers of carbon hard mask, boron nitride or hafnium based oxide. Other materials and/or layer thicknesses may be employed.

BARC layer 208 may include any suitable antireflection coating such as an inorganic dielectric (e.g., SiO2, SixNy, oxynitride, etc.), an organic spin-on film, etc. In some embodiments, BARC layer 208 may be about 5 to about 20 nanometers of any of the above. Other BARC materials and/or thicknesses may be employed.

PR mandrels 210a, 210b may be formed from any suitable photoresist, such as a negative or positive photoresist. Examples include commercially available resists from JSR Corporation of Tokyo, Japan, Dow Corning of Midland, Mich., Shin-Etsu Chemical Co., Ltd. of Tokyo, Japan, etc. In one or more embodiments, the PR mandrels 210a, 210b may have a width of about 40 nm, a height of about 50 nm and a spacing of about 60 nm. Other dimensions/configurations may be employed. If desired, the PR mandrels may be trimmed to reduce their width. As an example, a trim etch may be employed to reduce the width of the PR mandrels 210a, 210b from about 40 nm to about 36 nm. To perform such trimming, an etch chamber such as the Mesa etch chamber available from Applied Materials, Inc., of Santa Clara, Calif. or another suitable etch chamber may be employed. Trim etching may be performed on the substrate 200 prior to delivery to the cluster tool 100, or within the cluster tool 100 using a suitable trim etch chamber and process. In some embodiments, a pulsed trim etch may be employed.

Referring to FIG. 2B, following delivery of substrate 200 to cluster tool 100 (and/or after any trim etch), the substrate is transferred to ALD chamber 114. Within ALD chamber 114, a conformal layer 212 (S1) is formed over PR mandrels 210a, 210b. In some embodiments, conformal layer 212 may be about 12 nanometers of silicon dioxide, although other materials and/or thicknesses may be used. Additionally, in some embodiments the etch selectivity of the hard mask 206 (and/or 204) to the conformal layer 212 may be about 1:40. Other selectivity values may be employed. For example, a larger etch selectivity may allow for thinner hard mask layers.

Following formation of the conformal layer 212, the substrate 200 is transferred to an etch or plasma dry clean chamber such as process chamber 110 or 112 to remove the conformal layer 212 from any horizontal surfaces of the substrate 200. Sidewalls of the conformal layer 212 remain as shown in FIG. 2C. Thereafter, PR mandrels 210a, 210b are removed as shown in FIG. 2D, leaving pillars of conformal layer material 212. (Such pillars may be of any desired width, length and/or height.) For example, an ashing, etch, dry clean plasma or other removal process may be employed to remove PR material from between the sidewalls of conformal layer 212. Such PR removal may be performed in process chamber 108, 116 and/or 118, for example.

Following removal of the PR material 210a, 210b, the pattern from conformal layer material 212 (S1) is transferred into hard mask 206 by etching BARC layer 208 and hard mask 206 (see S1 features labeled by reference numeral 206 in FIG. 2E). This may be performed in process chamber 108, 116, 118 or any other suitable etch, dry clean or similar process chamber. In some embodiments, BARC layer 208 and hard mask layer 206 may be etched in the same etch step and/or etch chamber. In other embodiments, separate etch steps and/or chambers may be employed. Pillars of hard mask material 206 remain as shown by S1 in FIG. 2E.

Following etching of hard mask layer 206, substrate 200 is transferred to ALD chamber 124. Within ALD chamber 124, a conformal layer 214 (S2) is formed over S1 hard mask material 206 as shown in FIG. 2F. In some embodiments, conformal layer 214 may be about 12 nanometers of silicon nitride, although other materials and/or thicknesses may be used. Additionally, in some embodiments the etch selectivity between hard mask material 206 and conformal layer 214 may be about 1:20. Other selectivity values may be employed.

Following formation of the conformal layer 214, the substrate 200 is transferred to an etch or plasma dry clean chamber such as process chamber 120 or 122 to remove the conformal layer 214 from any horizontal surfaces of the substrate 200. Sidewalls of the conformal layer 214 remain over hard mask material 206 as shown in FIG. 2G. Thereafter, hard mask (S1) material 206 is removed from between conformal layer 214 sidewalls as shown in FIG. 2H (leaving pillars of conformal layer material 214 as shown by S2). For example, an etch, dry clean plasma or other removal process may be employed to remove hard mask 206 material from between the conformal layer material 214 features. Such material removal may be performed in process chamber 108, 116 and/or 118, for example.

Following removal of hard mask 206 material, the pattern from conformal layer material 214 features (S2) is transferred into hard mask layer 204 by etching hard mask layer 204 as shown in FIG. 2I. This may be performed in process chamber 108, 116, 118 or any other suitable etch, dry clean or similar process chamber. Substrate 200 then may be further processed within cluster tool 100, or transferred back to a substrate carrier via factory interface 126.

In some embodiments, if sufficient etch selectivity exists between conformal layer 212 and conformal layer 214, hard mask layer 206 may be eliminated in an alternative integrated process flow illustrated in FIGS. 2A'-2I'. Note that in the process flow of FIGS. 2A'-2I', FIG. 2E' (shown in phantom) is identical to FIG. 2D' and does not illustrate an additional process step.

Figure 3:
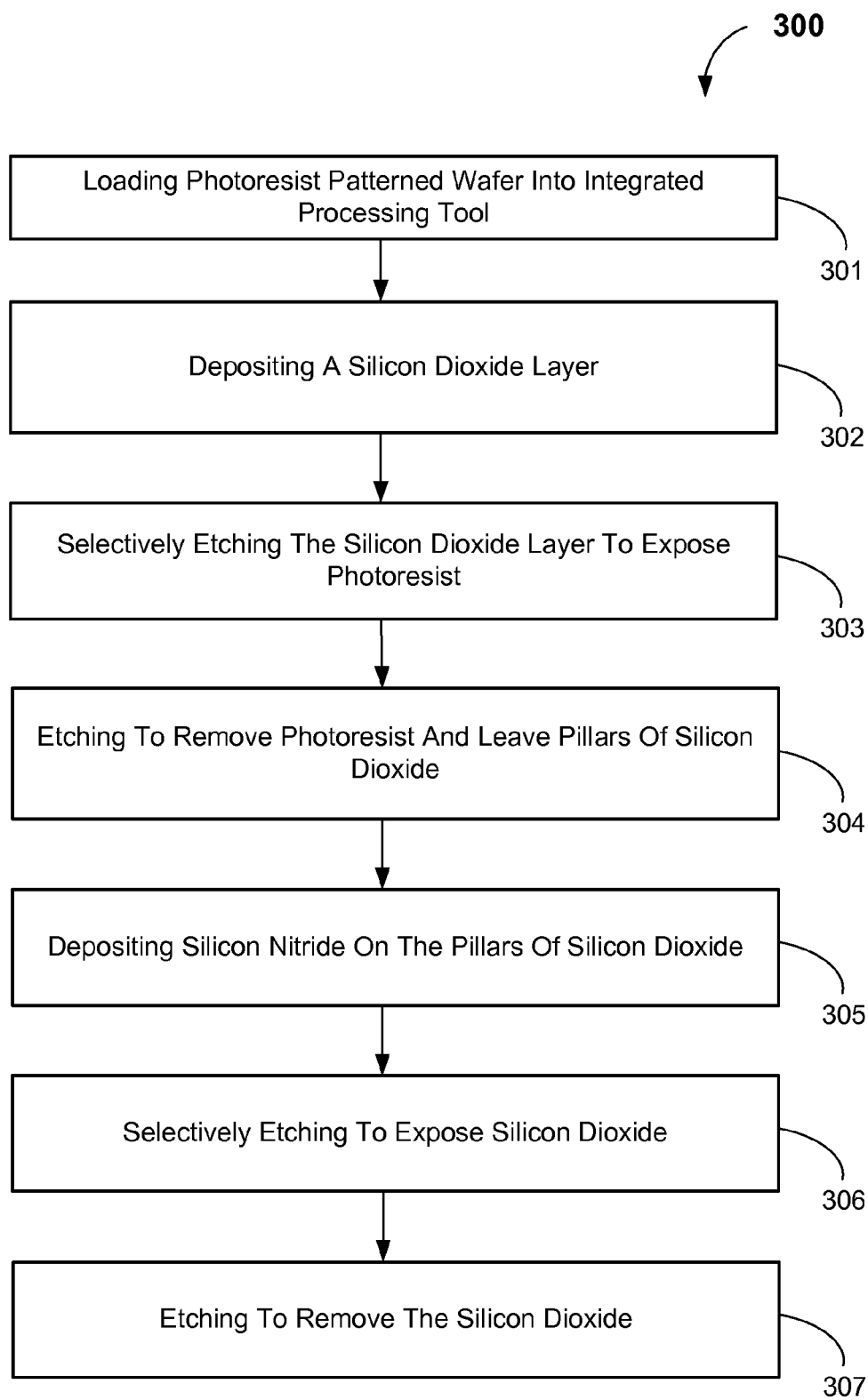
FIG. 3 is a flowchart of an example integrated process flow provided in accordance with embodiments of the present invention.

FIG. 3 is a flowchart of an additional example integrated process flow 300 provided in accordance with embodiments of the present invention. In some embodiments, integrated process flow 300 may be performed within a single mainframe processing tool, without breaking vacuum, such as within the cluster tool 100 of FIGS. 1A and/or 1B. Integrated process flow 300 is described with reference to FIGS. 4A-4F, which illustrate cross-sectional views of a substrate during the integrated process flow 300, in accordance with embodiments of the present invention.

Figure 4A:
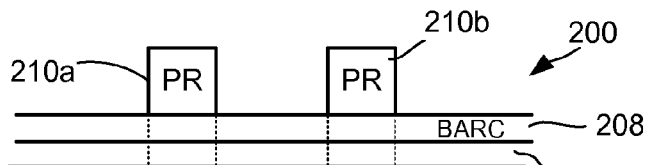
FIGS. 4A-4F are schematic cross-sectional views of a substrate during the integrated process flow of FIG. 3 in accordance with embodiments of the present invention.

With reference to FIGS. 3 and 4A, in Block 301 a substrate 200 is loaded into the cluster tool 100. The substrate may include a photoresist (PR) or other material layer pattern, such as mandrels 210a, 210b, and in some embodiments, a BARC layer 208 formed over a layer 202 to be patterned. In other embodiments the BARC layer 208 may be eliminated.

Figure 4B:
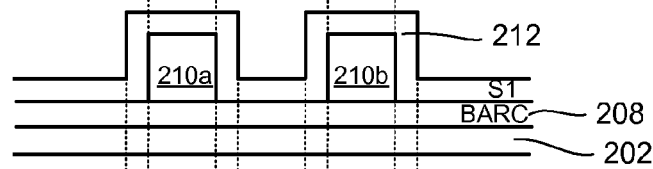
Figure 4C:
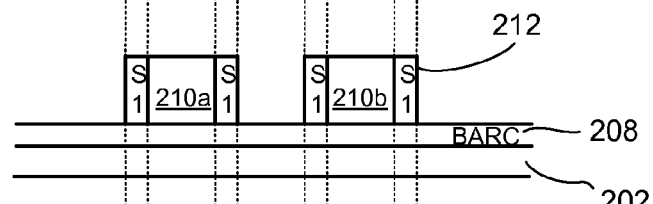

In Block 302 and FIG. 4B, a first layer 212 such as silicon dioxide is conformally deposited over the substrate 200, and in Block 303 and FIG. 4C, the silicon dioxide layer 212 is selectively etched to exposed the PR mandrels 210a, 210b (removing the conformal silicon dioxide from horizontal surfaces). In Block 304, the PR mandrels 210a, 210b are removed leaving pillars of silicon dioxide. In Block 305 and FIG. 4D, a second layer 214 such as silicon nitride is conformally deposited over the silicon dioxide pillars. In Block 306 and FIG. 4E, the silicon nitride layer 214 is selectively etched to expose the silicon oxide pillars (removing the conformal silicon nitride from horizontal surfaces). In Block 307 and FIG. 4F, the silicon dioxide material is removed, leaving the silicon nitride pillars. In some embodiments, the silicon nitride pillars may be employed as a hardmask during etching of the underlying layer(s) to be etched (e.g., layers 208 and/or 202). These steps may be performed within the cluster tool 100 without breaking vacuum. Metrology to confirm CD or other parameters may be performed at any desired step and/or frequency during the process flow 300. In general, the cluster tool 100 may be employed to process any material such as dielectrics, metals, organic or organic materials, etc., for any desired application (e.g., with or without hard masks, ALD spacers, or the like).

With reference to FIG. 4A, BARC layer 208 may include any suitable antireflection coating such as an inorganic dielectric (e.g., SiO2, SixNy, oxynitride, etc.), an organic spin-on film, etc. In some embodiments, BARC layer 208 may be about 5 to about 20 nanometers of any of the above. Other BARC materials and/or thicknesses may be employed.

PR mandrels 210a, 210b may be formed from any suitable photoresist, such as a negative or positive photoresist (FIG. 4A). Examples include commercially available resists from JSR Corporation of Tokyo, Japan, Dow Corning of Midland, Mich., Shin-Etsu Chemical Co., Ltd. of Tokyo, Japan, etc. In one or more embodiments, the PR mandrels 210a, 210b may have a width of about 40 nm, a height of about 50 nm and a spacing of about 60 nm. Other dimensions/configurations may be employed. If desired, the PR mandrels may be trimmed to reduce their width. As an example, a trim etch may be employed to reduce the width of the PR mandrels 210a, 210b from about 40 nm to about 36 nm. To perform such trimming, an etch chamber such as the Mesa etch chamber available from Applied Materials, Inc., of Santa Clara, Calif. or another suitable etch chamber may be employed. Trim etching may be performed on the substrate 200 prior to delivery to the cluster tool 100, or within the cluster tool 100 using a suitable trim etch chamber and process. In some embodiments, a pulsed trim etch may be employed.

In one or more embodiments, ALD chamber 114 may be employed to form conformal layer 212 (S1) over PR mandrels 210a, 210b (FIG. 4B). In some embodiments, conformal layer 212 may be about 12 nanometers of silicon dioxide, although other materials and/or thicknesses may be used. An etch or plasma dry clean chamber such as process chamber 110 or 112 may be employed to remove the conformal layer 212 from any horizontal surfaces of the substrate 200 (FIG. 4C). PR mandrels 210a, 210b may be removed in an ashing, etch, dry clean plasma or other removal process. Such PR removal may be performed in process chamber 108, 116 and/or 118, for example.

Figure 4D:
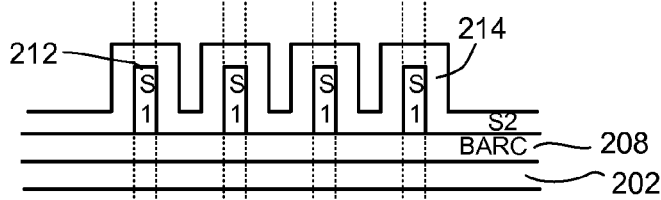

In some embodiments, ALD chamber 124 may be employed to deposit conformal layer 214 (S2) over S1 material 212 as shown in FIG. 4D. In some embodiments, conformal layer 214 may be about 12 nanometers of silicon nitride, although other materials and/or thicknesses may be used.

Figure 4E:
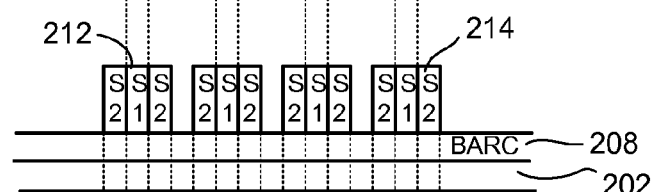
Figure 4F:
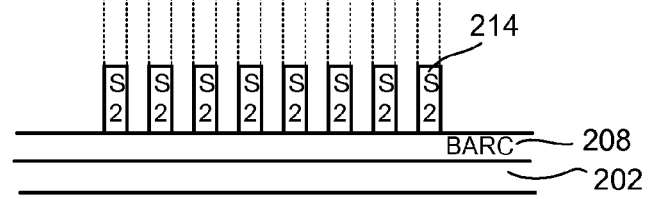

An etch or plasma dry clean chamber such as process chamber 120 or 122 may be employed to remove the conformal layer 214 from any horizontal surfaces of the substrate 200 (FIG. 4E). S1 material 212 may be removed from between conformal layer 214 sidewalls (FIG. 4F), with an etch, dry clean plasma or other removal process in process chamber 108, 116 and/or 118, for example.

The pattern from sidewall layer material 214 features (S2) (FIG. 4F) may be transferred into underlying layer 202 in process chamber 108, 116, 118 or any other suitable etch, dry clean or similar process chamber, for example. Substrate 200 then may be further processed within cluster tool 100, or transferred back to a substrate carrier via factory interface 126.

Through use of the cluster tool 100 of FIGS. 1A-1B, advanced patterning may be performed within a single mainframe to achieve quadruple patterning with a single lithography/exposure step. Etch, ALD, metrology and/or cleans may be integrated within a single tool, and/or performed as part of an integrated process flow without breaking vacuum.

The foregoing description discloses only example embodiments of the invention. Modifications of the above-disclosed systems, apparatus, and methods which fall within the scope of the invention will be readily apparent to those of ordinary skill in the art. For example, the controller 140 of FIGS. 1A and/or 1B may be programmed and/or otherwise configured to perform at least a portion of the process flows described with reference to FIGS. 2A-I, 2A'-2I'- and/or FIGS. 4A-4F. In general, multiple deposition, etch and clean (e.g., dry clean) cycles may be performed within the cluster tool 100 to divide pitch to any desired level (e.g., dividing pitch by 2, 4 or another power of 2).

In one or more embodiments, the cluster tool 100 may be configured to (a) receive a substrate having photoresist features formed on the substrate; (b) deposit a first conformal layer over the photoresist features; (c) remove first conformal layer material from horizontal surfaces of the substrate to expose the photoresist features; (d) remove the photoresist features to form pillars of first conformal layer material; (e) deposit a second conformal layer over the pillars of first conformal layer material; (f) remove second conformal layer material from horizontal surfaces of the substrate to expose the pillars of first conformal layer material; and/or (g) remove the pillars of first conformal layer material to form pillars of second conformal layer material. For example, the controller 140 may include hardware, software or a combination thereof to control cluster tool 100 to perform one or more of (a)-(g). The cluster tool 100 also may be configured to etch the substrate and/or a hard mask layer formed on the substrate using the pillars of second conformal layer material as an etch mask.

In one or more embodiments, the cluster tool 100 may be configured to (a) receive a substrate having photoresist features formed on the substrate; (b) deposit a first conformal layer over the photoresist features; (c) remove first conformal layer material from horizontal surfaces of the substrate to expose the photoresist features; (d) remove the photoresist features to form pillars of first conformal layer material; (e) etch a first hard mask layer on the substrate using the pillars of first conformal layer material as an etch mask to form pillars of first hard mask layer material; (f) deposit a second conformal layer over the pillars of first hardmask layer material; (g) remove second conformal layer material from horizontal surfaces of the substrate to expose the pillars of first hardmask layer material; and/or (h) remove the pillars of first hardmask layer material to form pillars of second conformal layer material. For example, the controller 140 may include hardware, software or a combination thereof to control cluster tool 100 to perform one or more of (a)-(h). The cluster tool 100 also may be configured to etch the substrate and/or a second hard mask layer formed on the substrate using the pillars of second conformal layer material as an etch mask.

Accordingly, while the present invention has been disclosed in connection with example embodiments thereof, it should be understood that other embodiments may fall within the scope of the invention, as defined by the following claims.

The invention claimed is:

1. An electronic device processing system, comprising:
   a processing tool including:
   a first subsystem configured to carry out a first subset of processes on a substrate having pattern features of a first pitch, the first subsystem including:
   a first conformal deposition chamber; and
   a first etch chamber; and
   a second subsystem coupled to the first subsystem and configured to carry out a second subset of processes on the substrate received from the first subsystem and having pattern features of a second pitch, the second pitch less than the first pitch, the second subsystem including:
   a second conformal deposition chamber; and
   a second etch chamber;
   wherein the processing tool is configured to employ the first and second subsystems to perform pitch division on the substrate within the processing tool and without transferring the substrate to another processing tool so as to form a reduced-pitch pattern on the substrate.

2. The system of claim 1 wherein:
   the first conformal deposition chamber comprises a first atomic layer deposition (ALD) chamber configured to deposit a first conformal layer on the substrate; and
   the second conformal deposition chamber comprises a second ALD chamber configured to deposit a second conformal layer on the substrate, the second conformal layer having a different etch rate than the first conformal layer.

3. The system of claim 2 wherein:
   the first ALD chamber is configured to deposit a layer of conformal silicon dioxide on the substrate; and
   the second ALD chamber is configured to deposit a layer of conformal silicon nitride on the substrate.

4. The system of claim 1 wherein the first subsystem includes a plurality of etch chambers and the second subsystem includes a plurality of etch chambers.

5. The system of claim 1 wherein the processing tool comprises at least seven etch chambers and two ALD chambers.

6. The system of claim 5 wherein the ALD chambers comprise batch ALD chambers.

7. The system of claim 1 wherein the processing tool is configured to:
   receive a substrate having photoresist features formed on the substrate;
   deposit a first conformal layer over the photoresist features;
   remove first conformal layer material from horizontal surfaces of the substrate to expose the photoresist features;
   remove the photoresist features to form pillars of first conformal layer material;
   deposit a second conformal layer over the pillars of first conformal layer material;
   remove second conformal layer material from horizontal surfaces of the substrate to expose the pillars of first conformal layer material; and
   remove the pillars of first conformal layer material to form pillars of second conformal layer material.

8. The system of claim 7 wherein the processing tool is configured to etch the substrate using the pillars of second conformal layer material as an etch mask.

9. The system of claim 7 wherein the processing tool is configured to etch a hard mask layer on the substrate using the pillars of second conformal layer material as an etch mask.

10. The system of claim 7 wherein the first conformal layer comprises silicon dioxide and the second conformal layer comprises silicon nitride.

11. The system of claim 1 wherein the processing tool is configured to:
    receive a substrate having photoresist features formed on the substrate;
    deposit a first conformal layer over the photoresist features;
    remove first conformal layer material from horizontal surfaces of the substrate to expose the photoresist features;
    remove the photoresist features to form pillars of first conformal layer material;
    etch a first hard mask layer on the substrate using the pillars of first conformal layer material as an etch mask to form pillars of first hard mask layer material;
    deposit a second conformal layer over the pillars of first hardmask layer material;
    remove second conformal layer material from horizontal surfaces of the substrate to expose the pillars of first hardmask layer material; and
    remove the pillars of first hardmask layer material to form pillars of second conformal layer material.

12. The system of claim 11 wherein the processing tool is configured to etch the substrate using the pillars of second conformal layer material as an etch mask.

13. The system of claim 11 wherein the processing tool is configured to etch a second hard mask layer on the substrate using the pillars of second conformal layer material as an etch mask.

14. A method of producing a reduced-pitch pattern on a substrate comprising:
providing a processing tool including:
a first subsystem configured to carry out a first subset of processes on a substrate having pattern features of a first pitch, the first subsystem including:
a first conformal deposition chamber; and
a first etch chamber; and
a second subsystem coupled to the first subsystem and configured to carry out a second subset of processes on the substrate received from the first subsystem and having pattern features of a second pitch, the second pitch less than the first pitch, the second subsystem including:
a second conformal deposition chamber; and
a second etch chamber; and
receiving a substrate having photoresist features formed on the substrate;
depositing a first conformal layer over the photoresist features within the processing tool;
removing first conformal layer material from horizontal surfaces of the substrate to expose the photoresist features within the processing tool;
removing the photoresist features to form pillars of first conformal layer material within the processing tool;
depositing a second conformal layer over the pillars of first conformal layer material within the processing tool;
removing second conformal layer material from horizontal surfaces of the substrate to expose the pillars of first conformal layer material within the processing tool; and
removing the pillars of first conformal layer material to form pillars of second conformal layer material within the processing tool.

15. The method of claim 14 wherein:
the first conformal deposition chamber comprises a first atomic layer deposition (ALD) chamber configured to deposit a first conformal layer on the substrate; and
the second conformal deposition chamber comprises a second ALD chamber configured to deposit a second conformal layer on the substrate, the second conformal layer having a different etch rate than the first conformal layer.

16. The method of claim 14 further comprising employing the processing tool to etch the substrate using the pillars of second conformal layer material as an etch mask.

17. The method of claim 14 further comprising employing the processing tool to etch a hard mask layer on the substrate using the pillars of second conformal layer material as an etch mask.

18. The method of claim 14 wherein the first conformal layer comprises silicon dioxide and the second conformal layer comprises silicon nitride.

19. A method of producing a reduced-pitch pattern on a substrate comprising:
providing a processing tool including:
a first subsystem configured to carry out a first subset of processes on a substrate having pattern features of a first pitch, the first subsystem including:
a first conformal deposition chamber; and
a first etch chamber; and
a second subsystem coupled to the first subsystem and configured to carry out a second subset of processes on the substrate received from the first subsystem and having pattern features of a second pitch, the second pitch less than the first pitch, the second subsystem including:
a second conformal deposition chamber; and
a second etch chamber; and
receiving a substrate having photoresist features formed on the substrate;
depositing a first conformal layer over the photoresist features within the processing tool;
removing first conformal layer material from horizontal surfaces of the substrate to expose the photoresist features within the processing tool;
removing the photoresist features to form pillars of first conformal layer material within the processing tool;
etching a first hard mask layer on the substrate using the pillars of first conformal layer material as an etch mask to form pillars of first hard mask layer material within the processing tool;
depositing a second conformal layer over the pillars of first hardmask layer material within the processing tool;
removing second conformal layer material from horizontal surfaces of the substrate to expose the pillars of first hardmask layer material within the processing tool; and
removing the pillars of first hardmask layer material to form pillars of second conformal layer material within the processing tool.

20. The method of claim 19 further comprising employing the processing tool to etch the substrate using the pillars of second conformal layer material as an etch mask.

21. The method of claim 19 further comprising employing the processing tool to etch a second hard mask layer on the substrate using the pillars of second conformal layer material as an etch mask.

* * * * *